(12) United States Patent
Shindo et al.

(10) Patent No.: US 8,192,596 B2
(45) Date of Patent: *Jun. 5, 2012

(54) ULTRAHIGH-PURITY COPPER AND PROCESS FOR PRODUCING THE SAME

(75) Inventors: Yuichiro Shindo, Ibaraki (JP); Kouichi Takemoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1083 days.

This patent is subject to a terminal disclaimer.

(21) Appl. No.: 10/597,449

(22) PCT Filed: Jan. 5, 2005

(86) PCT No.: PCT/JP2005/000015
§ 371 (c)(1),
(2), (4) Date: Jul. 26, 2006

(87) PCT Pub. No.: WO2005/073434
PCT Pub. Date: Aug. 11, 2005

(65) Prior Publication Data
US 2008/0223728 A1 Sep. 18, 2008

(30) Foreign Application Priority Data
Jan. 29, 2004 (JP) .................................. 2004-020850

(51) Int. Cl.
*C23C 14/34* (2006.01)

(52) U.S. Cl. ............... 204/298.02; 204/298.01; 148/432; 420/469; 420/497

(58) Field of Classification Search .................. 560/104; 562/494–495; 148/404, 432; 420/469, 497, 420/500
See application file for complete search history.

(56) References Cited

U.S. PATENT DOCUMENTS

| | | | | |
|---|---|---|---|---|
| 4,792,369 | A * | 12/1988 | Ogata et al. ............... | 148/404 |
| 5,206,430 | A * | 4/1993 | Itoh et al. ..................... | 562/494 |
| 6,451,135 | B1 | 9/2002 | Takahashi et al. | |
| 6,896,788 | B2 | 5/2005 | Shindo et al. | |
| 7,435,325 | B2 | 10/2008 | Shindo et al. | |
| 7,507,304 | B2 * | 3/2009 | Okabe et al. ................. | 148/432 |
| 2004/0069652 | A1 | 4/2004 | Shindo et al. | |
| 2005/0285273 | A1 | 12/2005 | Okabe et al. | |
| 2009/0004498 | A1 | 1/2009 | Shindo et al. | |
| 2009/0272466 | A1 * | 11/2009 | Shindo et al. .................. | 148/432 |
| 2010/0163425 | A1 | 7/2010 | Shindo et al. | |

FOREIGN PATENT DOCUMENTS

| | | |
|---|---|---|
| JP | H02-185990 A | 7/1990 |
| JP | 04-259359 A | 9/1992 |
| JP | 08-108251 A | 4/1996 |
| JP | 09-063362 A | 3/1997 |
| JP | 10007491 A | 1/1998 |
| JP | 11-229172 A | 8/1999 |

OTHER PUBLICATIONS

S. Fujiwara, K. Abiko, "Ductility of Ultra High Purity Copper", Journal De Physique IV, Colloque C7, supplement au Journal de Physique III, vol. 5, Nov. 1995, C7-295 to C7-300.*
Esp@cenet database, one page English Abstract of JP 2-185990, Jul. 1990.
Esp@cenet database, one page English Abstract of JP 4-224662, Aug. 1992.
Esp@cenet database, one page English Abstract of JP 3-020656, Jan. 1991.
Esp@cenet database, one page English Abstract of JP 5-309448, Nov. 1993.
Y. Ishikawa et al., "Floating Zone-Melting of Iron and Copper under Reduced Hydrogen Atmosphere", pp. 10-18, Sep. 29, 1995.
Y. Niitsu, "Tensile Test of Serially Poly-Crystallized Nb Wire", Tokyo Denki University, pp. 106-108, 1998 (month unknown).

* cited by examiner

*Primary Examiner* — Kaj K Olsen
*Assistant Examiner* — Susan D Leong
(74) *Attorney, Agent, or Firm* — Howson & Howson LLP

(57) ABSTRACT

Ultrahigh purity copper having a residual resistance ratio of 38,000 or greater and a purity of 8N or higher (excluding gas components), and in particular ultrahigh purity copper wherein the respective elements of O, C, N, H, S and P as gas components are 1 ppm or less. Further provided is a method of subjecting copper to high purification. An anode and a cathode are partitioned with an anion exchange membrane, an anolyte is intermittently or continuously extracted and introduced into an active carbon treatment vessel, a chlorine-containing material is added to the active carbon treatment vessel so as to precipitate impurities as chloride, active carbon is subsequently poured in and agitated so as to adsorb the precipitated impurities, the adsorbed impurities are removed by filtration, and the obtained high purity copper electrolytic solution is intermittently or continuously introduced into the cathode side and electrolyzed.

6 Claims, No Drawings

ULTRAHIGH-PURITY COPPER AND PROCESS FOR PRODUCING THE SAME

BACKGROUND OF THE INVENTION

The present invention relates to ultrahigh purity copper having a purity of 8N (99.999999 wt %) or higher and the manufacturing method thereof in which a single electrolytic vessel is used to perform the dissolution and extraction of raw material copper.

High purity copper is characterized in that the recrystallization temperature is low and it is soft, there is hardly any brittleness in the intermediate temperature range and it has favorable workability, the electrical resistance is small at ultracold temperatures and it has high thermal conductivity, and also characterized in that it is subject to great influence from improved characteristics due to addition of infinitesimal quantity of elements or impurity contamination.

High purity copper is widely used as various electronic component materials and semiconductor device materials by utilizing the foregoing characteristics. In particular, when using a sputtering target to form a high purity copper thin film, stability of the deposition characteristics and deposition conditions depend largely on the purity of the target, and the high purification of target materials is strongly demanded.

As conventional technology, there are disclosed ultrahigh purity copper having a purity of 99.99999% (7N) or higher in which the elongation at room temperature is 30% or higher and the Vickers hardness is 42 or less (for instance, refer to Patent Document 1), a manufacturing method of high RRR (residual resistance ratio) copper material in which a copper material having a purity of 99.999% or higher is heated at 650 to 800° C. in an inert gas atmosphere for at least 30 minutes or longer (for instance, refer to Patent Document 2), and a method of evaluating the purity of copper by measuring the residual resistance ratio of copper having a purity of 99.999 wt % or higher and creating in advance an analytical curve between such residual resistance ratio and purity, measuring the residual resistance ratio of copper subject to purity evaluation, and measuring the purity of copper using the analytical curve based on the measurement results (for instance, refer to Patent Document 3).

Further disclosed are a superconducting copper material formed from high purity copper containing silver in an amount of 1 ppm or less and sulfur in an amount of 0.5 ppm or less (for instance, refer to Patent Document 4), and a manufacturing method of monocrystal copper in which high purity copper having a purity of 6N (99.9999%) or higher containing Ag in the range of 2 to 50 ppm is placed in a mold and extracted at a casting speed of 50 mm/minute or slower (for instance, refer to Patent Document 5).

[Patent Document 1] Japanese Patent Laid-Open Publication No. H2-185990
[Patent Document 2] Japanese Patent Laid-Open Publication No. H4-224662
[Patent Document 3] Japanese Patent Laid-Open Publication No. H3-20656
[Patent Document 4] Japanese Patent Laid-Open Publication No. S64-56399
[Patent Document 5] Japanese Patent Laid-Open Publication No. H5-309448

SUMMARY OF THE INVENTION

An object of the present invention is to provide technology for efficiently manufacturing ultrahigh purity copper having a purity of 8N (99.999999 wt %) or higher from a copper raw material containing large amounts of impurities by performing electrolysis with a copper-containing solution, and to provide ultrahigh purity copper obtained thereby.

In order to overcome the foregoing conventional problems, on the premise that high purification is to be performed by electrolytic winning or electrolytic refining, the present inventors discovered that it is possible to efficiently manufacture ultrahigh purity copper by removing impurities from anolyte of a copper-containing solution by performing active carbon treatment, and by using the high purity copper solution from which the impurities have been removed as a catholyte.

Based on the foregoing discovery, the present invention provides 1) ultrahigh purity copper having a residual resistance ratio of 38,000 or greater and a purity of 8N or higher (excluding gas components of O, C, N, H, S and P); and 2) the ultrahigh purity copper according to 1) above, wherein the respective elements of O, C, N, H, S and P as gas components are 1 ppm or less.

The present invention also provides 3) a manufacturing method of ultrahigh purity copper, wherein, upon subjecting copper to high purification with the electrolytic method, an anode and a cathode are partitioned with an anion exchange membrane, an anolyte is intermittently or continuously extracted, active carbon is poured in and agitated so as to adsorb the impurities, and the obtained high purity copper electrolytic solution is intermittently or continuously introduced into the cathode side and electrolyzed; and 4) a manufacturing method of the ultrahigh purity copper according to 1) or 2) above, wherein, upon subjecting copper to high purification with the electrolytic method, an anode and a cathode are partitioned with an anion exchange membrane, an anolyte is intermittently or continuously extracted, active carbon is poured in and agitated so as to adsorb the impurities, and the obtained high purity copper electrolytic solution is intermittently or continuously introduced into the cathode side and electrolyzed.

As described above, on the premise that high purification is to be performed by electrolytic winning or electrolytic refining, the present invention yields a superior effect in that it is possible to efficiently manufacture ultrahigh purity copper having a purity of 8N (99.999999 wt %) or higher from a copper raw material containing large amounts of impurities by removing the impurities contained in the electrolytic solution by performing active carbon treatment to anolyte of a copper-containing solution, and by using the high purity copper solution from which the impurities have been removed as a catholyte.

DETAILED DESCRIPTION OF THE INVENTION

A commercially available copper raw material having a purity level of 2N to 4N was used as an anode, and a cathode was used to perform electrolysis. The copper raw material primarily contains large amounts of silver, selenium and other elements.

It is desirable to use an acidic solution that does not contain S as the electrolytic solution, and specifically nitric acid, hydrochloric acid or the like is used. The raw material copper is dissolved in the electrolytic solution by the anode (so as to form anolyte).

The foregoing anode and cathode are partitioned with an ion exchange membrane, and the anolyte is intermittently or continuously extracted. The catholyte is separated from the outside solution (anolyte) via the ion exchange membrane.

There is no particular limitation on the ion exchange membrane so as long as it is a membrane that does not allow the Cu ion to pass through.

Active carbon is added to the extracted anolyte and agitated. The impurities in the solution will adsorb to the active carbon, and be removed from the solution through filtration. Here, impurities can be more effectively removed by adding a solution containing chlorine ion. Solvent extraction and so on may also be performed as needed.

The highly purified copper electrolytic solution from which the impurities have been removed is intermittently or continuously introduced into the cathode side, and used as catholyte to perform electrolytic winning.

As a result, it is possible to obtain electrodeposited copper (deposited to the cathode) having a purity of 8N. In other words, this copper has a purity level of 8N (99.999999 wt %) or higher excluding gas components, and all metallic components as impurities can be made to be 0.01 wt ppm or less.

Further, the electrodeposited copper obtained via electrolysis can be further subject to vacuum melting such as electron beam melting. As a result of such vacuum melting, alkali metals such as Na and K and other volatile impurities and gas components such as Cl can be effectively removed. Gas components can be further reduced by performing degassing with reducing gas as needed.

EXAMPLES

Examples of the present invention are now explained. These Examples merely illustrate a preferred example, and the present invention shall in no way be limited thereby. In other words, all modifications, other embodiments and modes covered by the technical spirit of the present invention shall be included in this invention.

Example 1

50 kg of aggregated copper raw material having a purity level of 4N was used as an anode, and a copper plate was used as a cathode to perform electrolysis. The impurity content of raw materials is shown in Table 1. Incidentally, Table 1 also shows the impurity content of conventional 6N copper.

The copper raw material primarily contains large amounts of selenium, silver, carbon, sulfur, chlorine and the like. For example, as shown in Table 1, the copper raw material contains 3.1 wt ppm of S, 7.8 wt ppm of Ag, 7.6 wt ppm of Cl, and 3.2 wt ppm of Se.

Electrolysis was performed at a bath temperature of 30° C. using a nitric acid electrolytic solution, pH of 1.3, and current density of 1 A/dm$^2$. At the initial stages of electrolysis, the Cu concentration at the anode side was 1 g/L or less. After the electrolysis, 100 L of Cu was extracted with the Cu concentration as 100 g/L.

TABLE 1

| Impurity Element | 4 N Copper | 6 N Copper | 8 to 9 N Copper |
|---|---|---|---|
| Al | 0.2 | 0.004 | <0.001 |
| S | 3.1 | <0.005 | <0.005 |
| Cl | 7.6 | 0.02 | <0.01 |
| Fe | 0.3 | 0.002 | <0.001 |
| Ni | 0.1 | <0.001 | <0.001 |
| As | 1.0 | <0.005 | <0.005 |
| Se | 3.2 | <0.01 | <0.01 |
| Ag | 7.8 | 0.25 | <0.005 |
| Sb | 0.3 | <0.005 | <0.005 |
| Pb | 0.2 | <0.001 | <0.001 |
| Bi | 2 | <0.001 | <0.001 |
| Si | 1.0 | 0.05 | <0.01 |
| Cr | 2.1 | <0.005 | <0.005 |
| Co | 1.0 | 0.007 | <0.005 |
| Na | 0.2 | <0.01 | <0.01 |
| K | 0.1 | <0.01 | <0.01 |
| Ti | 1.0 | 0.03 | <0.01 |
| V | 0.1 | <0.001 | <0.001 |
| Ca | 0.1 | <0.001 | <0.001 |
| Mg | 0.2 | <0.001 | <0.001 |
| Zn | 0.5 | <0.01 | <0.01 |
| W | 2.1 | <0.09 | <0.001 |
| Residual Resistance Ratio | 200~500 | 6000~10,000 | 40,000~100,000 |
| Quality of Standard Thermometric Sample | X | ○ | ◉ |
| Particle Amount | large | small | smallest |

The extracted anolyte was introduced into an active carbon treatment vessel, and 13 mg of copper chloride was added. Thereafter, 30 g/L of active carbon was added to remove the impurities.

This solution was introduced into the cathode side to perform electrolytic winning. Roughly 8 kg of Cu was obtained on the cathode side. This Cu was subject to vacuum melting at 10$^{-3}$ Pa to obtain an ingot. A pole of 3 mm angles×100 mm was cut out and annealed under H$_2$ atmosphere at 600° C. for 2 hours.

The residual resistance ratio of the pole was measured using the 4-terminal method. The result was 17 μΩm at 293K and 4.25×10$^{-4}$ μΩ·m at 4.2K, and the residual resistance ratio showed a value of 40,000. The impurity content of the ultrahigh purity copper obtained in the Examples is shown in Table 1.

In addition, as a result of using this material as the standard thermometric material, there was hardly any error even upon the use of such material 100 times.

Comparative Example 1

5 kg of commercially available Cu having a purity level of 4N was used to repeat zone-melting/refining 20 times. As a result, the residual resistance ratio showed a value of 10,000, and, although high purity Cu was obtained, it took 20 days to obtain such high purity Cu. In addition, it did not satisfy the condition of the present invention where the residual resistance ratio is 38,000 or greater.

Comparative Example 2

5 kg of commercially available Cu having a purity level of 4N was used as an anode to perform electrolysis in a nitric acid bath, and Cu electrodeposited to a cathode was used as an anode to perform electrolysis in a nitric acid bath.

As a result, although it was possible to obtain 3.5 kg of Cu in which the residual resistance ratio was 2.54×10$^{-3}$ μΩ·m at 4.2K showing a value of 6,700, this Cu did not satisfy the condition of the present invention where the residual resistance ratio is 38,000 or greater.

Comparative Example 3

As a result of measuring commercial available Cu having a purity of 4N as is, the residual resistance ratio was 0.0425

μΩ·m at 4.2K and showed a value of 400, and the result showed an extremely inferior value.

Cu of foregoing Example 1, Comparative Example 1 and Comparative Example 2 was used to examine the melting point. This was performed 5 times each. As a result, the error in Example 1 was ±0.1° C.

Meanwhile, the error in Comparative Example 1 was ±1° C., and the error in Comparative Example 2 was ±2° C. Further, the error in Comparative Example 3 was ±10° C., and it has been confirmed that the influence of purity is significant.

When using a sputtering target to form a high purity copper thin film, the deposition characteristics and deposition conditions stability depend largely on the purity of the target. In light of this point, a target was prepared using the ultrahigh purity copper obtained in Example 1, and a conventional 4N copper target and 6N high purity copper target were prepared, and these were used to perform sputtering and the generation of particles at such time was measured.

As a result, the generation of large amounts of particles was observed with the 4N copper target material, but only the generation of small amounts of particles was observed with the 6N high purity copper target. In addition, the target material of Example 1 showed the generation of the smallest amounts of particles. Accordingly, it has been confirmed that an ultrahigh purity copper target is superior in deposition characteristics.

As described above, on the premise that high purification is to be performed by electrolytic winning or electrolytic refining, it is possible to efficiently manufacture ultrahigh purity copper having a purity of 8N (99.999999 wt %) or higher from a copper raw material containing large amounts of impurities by removing the impurities contained in the electrolytic solution by performing active carbon treatment to anolyte of a copper-containing solution, and using the high purity copper solution from which the impurities have been removed as a catholyte. This kind of ultrahigh purity copper can be widely applied as AV equipment cable conductors, IC bonding wires, LSI wring materials, wiring or copper foils subject to repeated bending, superconducting stabilization copper, various electronic component materials of cryo equipment, semiconductor device materials, and so on.

The invention claimed is:

1. Ultrahigh purity copper having a residual resistance ratio of 40,000 to 100,000, and a purity of 8N or higher, gas components of O, C, N, H, S and P being excluded from a determination of said purity, and a content of impurities in said ultrahigh purity copper excluding said gas components totaling no more than 0.01 ppm wherein the content of silver (Ag) in said ultrahigh purity copper is less than 0.005 ppm, the content of aluminum (Al) in said ultrahigh purity copper is less than 0.001 ppm, and the content of iron (Fe) in said ultrahigh purity copper is less than 0.001 ppm.

2. The ultrahigh purity copper according to claim 1, wherein the respective elements of O, C, N, H, S and P as gas components are 1 ppm or less.

3. An ultrahigh purity copper according to claim 1, prepared by a process comprising the steps of, upon subjecting copper to high purification with an electrolytic method, partitioning an electrolytic bath with an anion exchange membrane into an anode side and a cathode side of the electrolytic bath, intermittently or continuously extracting an anolyte from the anode side of said electrolytic bath, adding active carbon into the extracted anolyte and agitating the extracted anolyte to absorb impurities to the active carbon, removing the absorbed impurities together with the active carbon from the extracted anolyte by filtration to obtain a high purity copper electrolytic solution, and intermittently or continuously pouring the high purity copper electrolytic solution into the cathode side of the electrolytic bath, and electrolyzing the high purity copper electrolytic solution.

4. An ultrahigh purity copper according to claim 3, wherein the respective elements of O, C, N, H, S and P as gas components are 1 ppm or less.

5. An ultrahigh purity copper according to claim 3, wherein a content of sulfur (S) in the ultrahigh purity copper is less than 0.005 ppm.

6. A copper sputtering target having superior deposition characteristics made from the ultrahigh purity copper according to claim 5.

* * * * *